(12) United States Patent
Fay et al.

(10) Patent No.: US 11,552,045 B2
(45) Date of Patent: Jan. 10, 2023

(54) SEMICONDUCTOR ASSEMBLIES WITH REDISTRIBUTION STRUCTURES FOR DIE STACK SIGNAL ROUTING

(71) Applicant: Micron Technology, Inc., Boise, ID (US)

(72) Inventors: Owen R. Fay, Meridian, ID (US); Madison E. Wale, Boise, ID (US); James L. Voelz, Boise, ID (US); Dylan W. Southern, Meridian, ID (US); Dustin L. Holloway, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/100,610

(22) Filed: Nov. 20, 2020

(65) Prior Publication Data

US 2022/0052021 A1 Feb. 17, 2022

Related U.S. Application Data

(60) Provisional application No. 63/066,436, filed on Aug. 17, 2020.

(51) Int. Cl.
*H01L 23/00* (2006.01)

(52) U.S. Cl.
CPC ............. *H01L 24/82* (2013.01); *H01L 24/20* (2013.01); *H01L 24/29* (2013.01); *H01L 24/45* (2013.01);
(Continued)

(58) Field of Classification Search
CPC ......... H01L 24/82; H01L 24/20; H01L 24/29; H01L 24/45; H01L 24/83; H01L 24/85;
(Continued)

(56) References Cited

U.S. PATENT DOCUMENTS

2005/0212114 A1* 9/2005 Kawano ................. H01L 24/83
257/690
2012/0292745 A1* 11/2012 Park ..................... H01L 25/0652
257/621
(Continued)

FOREIGN PATENT DOCUMENTS

| CN | 102790042 A | 11/2012 |
| TW | 201822284 A | 6/2018 |
| TW | 201834189 A | 9/2018 |

OTHER PUBLICATIONS

TW Patent Application No. 110129080—Taiwanese Office Action and Search Report, dated Mar. 17, 2022, with English Translation, 13 pages.

*Primary Examiner* — Didarul A Mazumder
(74) *Attorney, Agent, or Firm* — Perkins Coie LLP

(57) ABSTRACT

Semiconductor devices having redistribution structures, and associated systems and methods, are disclosed herein. In some embodiments, a semiconductor assembly comprises a die stack including a plurality of semiconductor dies, and a routing substrate mounted on the die stack. The routing substrate includes an upper surface having a redistribution structure. The semiconductor assembly also includes a plurality of electrical connectors coupling the redistribution structure to at least some of the semiconductor dies. The semiconductor assembly further includes a controller die mounted on the routing substrate. The controller die includes an active surface that faces the upper surface of the routing substrate and is electrically coupled to the redistribution structure, such that the routing substrate and the semiconductor dies are electrically coupled to the controller die via the redistribution structure.

24 Claims, 7 Drawing Sheets

(52) U.S. Cl.
CPC .............. *H01L 24/83* (2013.01); *H01L 24/85* (2013.01); *H01L 2224/82203* (2013.01); *H01L 2924/1431* (2013.01); *H01L 2924/1434* (2013.01)

(58) Field of Classification Search
CPC ... H01L 2224/82203; H01L 2924/1431; H01L 2924/1434; H01L 25/0652; H01L 25/18; H01L 24/96; H01L 25/50; H01L 23/3135; H01L 25/03; H01L 24/97; H01L 25/16; H01L 23/49827; H01L 23/49833; H01L 23/49816; H01L 23/49811
USPC ................. 257/734, 735; 438/411, 461, 611
See application file for complete search history.

(56) References Cited

U.S. PATENT DOCUMENTS

| | | | |
|---|---|---|---|
| 2013/0175701 A1* | 7/2013 | Park | H01L 21/566 257/774 |
| 2015/0303132 A1* | 10/2015 | Michael | H01L 24/13 257/675 |
| 2017/0243858 A1* | 8/2017 | Chou | H01L 23/49827 |
| 2018/0158768 A1 | 6/2018 | Kim et al. | |
| 2021/0104494 A1* | 4/2021 | Vodrahalli | H01L 24/48 |

\* cited by examiner

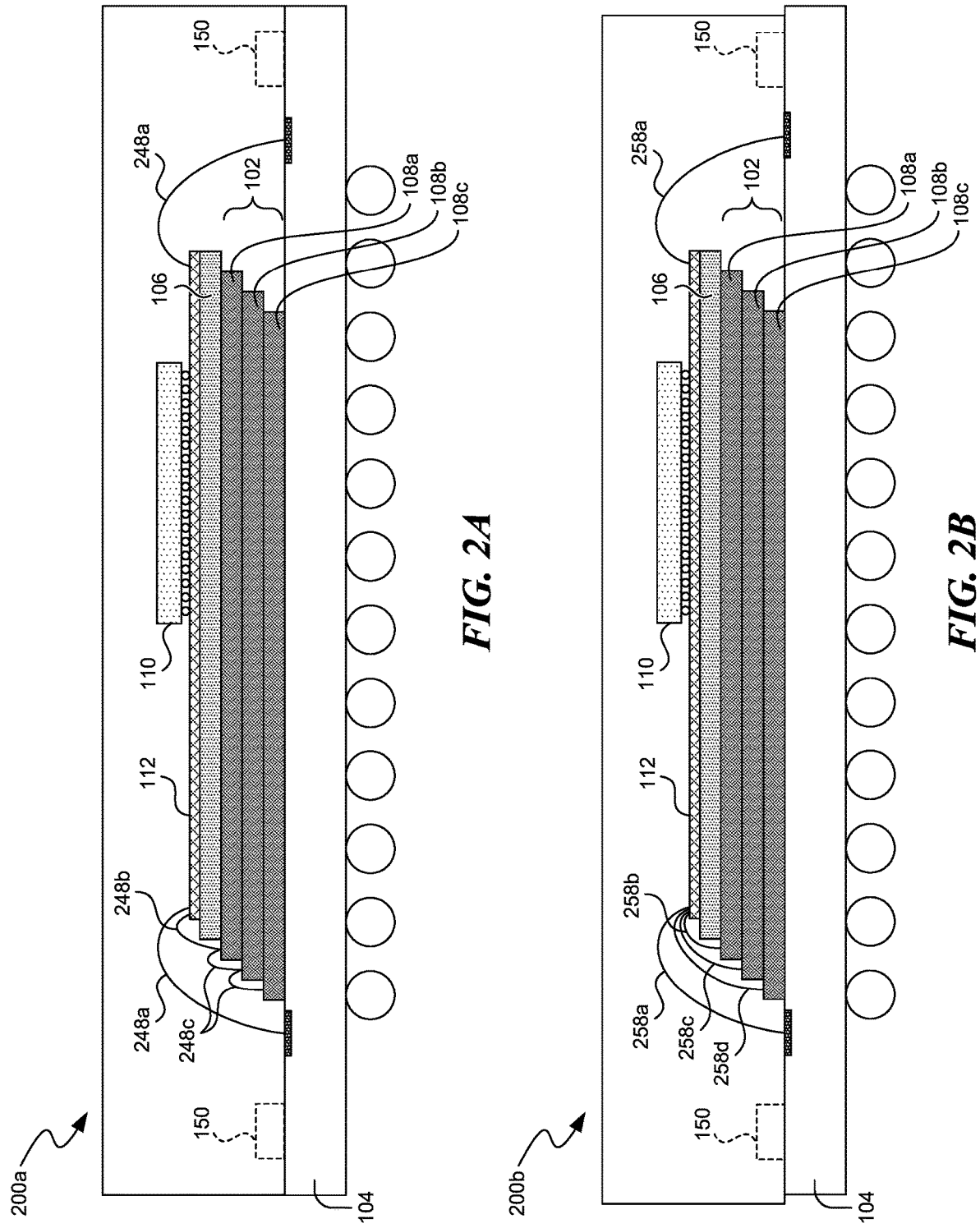

SEMICONDUCTOR ASSEMBLIES WITH REDISTRIBUTION STRUCTURES FOR DIE STACK SIGNAL ROUTING

CROSS-REFERENCE TO RELATED APPLICATION

This application claims the benefit of U.S. Provisional Application No. 63/066,436, filed Aug. 17, 2020, which is incorporated by reference herein in its entirety.

TECHNICAL FIELD

The present technology generally relates to semiconductor devices, and more particularly relates to semiconductor devices having redistribution structures configured to route signals between vertically stacked semiconductor dies.

BACKGROUND

Packaged semiconductor dies, including memory chips, microprocessor chips, and imager chips, typically include a semiconductor die mounted on a substrate and encased in a protective covering. The semiconductor die can include functional features, such as memory cells, processor circuits, and imager devices, as well as bond pads electrically connected to the functional features. The bond pads can be electrically connected to terminals outside the protective covering to allow the semiconductor die to be connected to higher level circuitry.

Market pressures continually drive semiconductor manufacturers to reduce the size of die packages to fit within the space constraints of electronic devices, while also driving them to increase the functional capacity of each package to meet operating parameters. One approach for increasing the processing power of a semiconductor package without substantially increasing the surface area covered by the package (the package's "footprint") is to vertically stack multiple semiconductor dies on top of one another in a single package. The dies in such vertically-stacked packages can be electrically coupled to each other and/or to a substrate via wires, interconnects, or other conductive structures. However, conventional techniques for routing signals to and from vertically-stacked semiconductor dies may rely on complicated multilayered routing structures within the package substrate, which may result in reduced signal integrity, larger package sizes, and increased manufacturing costs.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

FIG. 2A is a side cross-sectional view of a semiconductor package including a plurality of electrical connectors configured in accordance with embodiments of the present technology.

FIG. 2B is a side cross-sectional view of another semiconductor package including a plurality of electrical connectors configured in accordance with embodiments of the present technology.

DETAILED DESCRIPTION

Figure 1A:
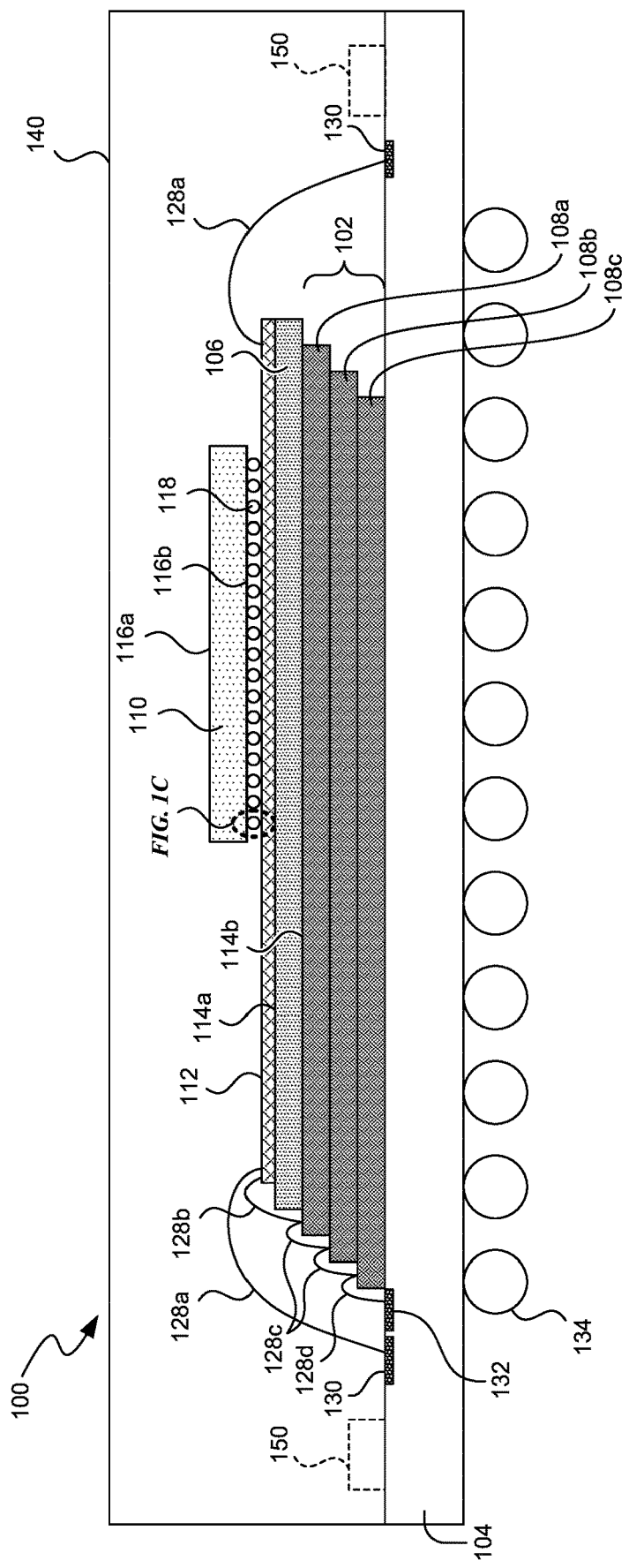
FIG. 1A is a side cross-sectional view of a semiconductor package configured in accordance with embodiments of the present technology.

Specific details of several embodiments of semiconductor devices, and associated systems and methods, are described below. In some embodiments, for example, a semiconductor assembly includes one or more die stacks each having a plurality of semiconductor dies, and a routing substrate (e.g., another semiconductor die or an interposer) mounted on the die stack(s). The routing substrate includes an upper surface having a redistribution structure and a lower surface coupled to the uppermost semiconductor die(s) of the die stack(s). The redistribution structure can be coupled to some or all of the semiconductor dies via a plurality of electrical connectors (e.g., wirebonds). The semiconductor assembly can further include a controller die mounted on the routing substrate (e.g., via a flip chip process). The controller die can include an active surface that faces the upper surface of the routing substrate and is electrically coupled to the redistribution structure, such that the routing substrate and semiconductor dies are electrically coupled to the controller die via the redistribution structure. Accordingly, the redistribution structure and electrical connectors can route signals between the controller die and the die stack(s). In contrast to devices where the controller die is mounted on a package substrate and spaced apart from the die stack(s), the devices described herein can reduce and/or simplify the signal routing through the package substrate because the controller die can communicate with the die stack(s) via the redistribution structure and wirebonds (or other electrically connectors) instead of the package substrate. As a result, thinner and less complex package substrates can be used, which reduces package heights and manufacturing costs. The present technology can also improve signal integrity and impedance, such as reducing or eliminating crosstalk from overlapping signals that may arise with substrate routing, since the signals are routed through the redistribution structure. Additionally, the techniques described herein allow the controller die to be mounted directly onto the routing substrate via a flip chip process without any intervening spacers or supports, which may simplify the manufacturing process and further reduce the package size. Moreover, the routing substrate can be used to physically and electrically bridge multiple die stacks on a single package substrate, which can improve the mechanical strength of the overall package and mitigate warpage.

A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-4. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1B:
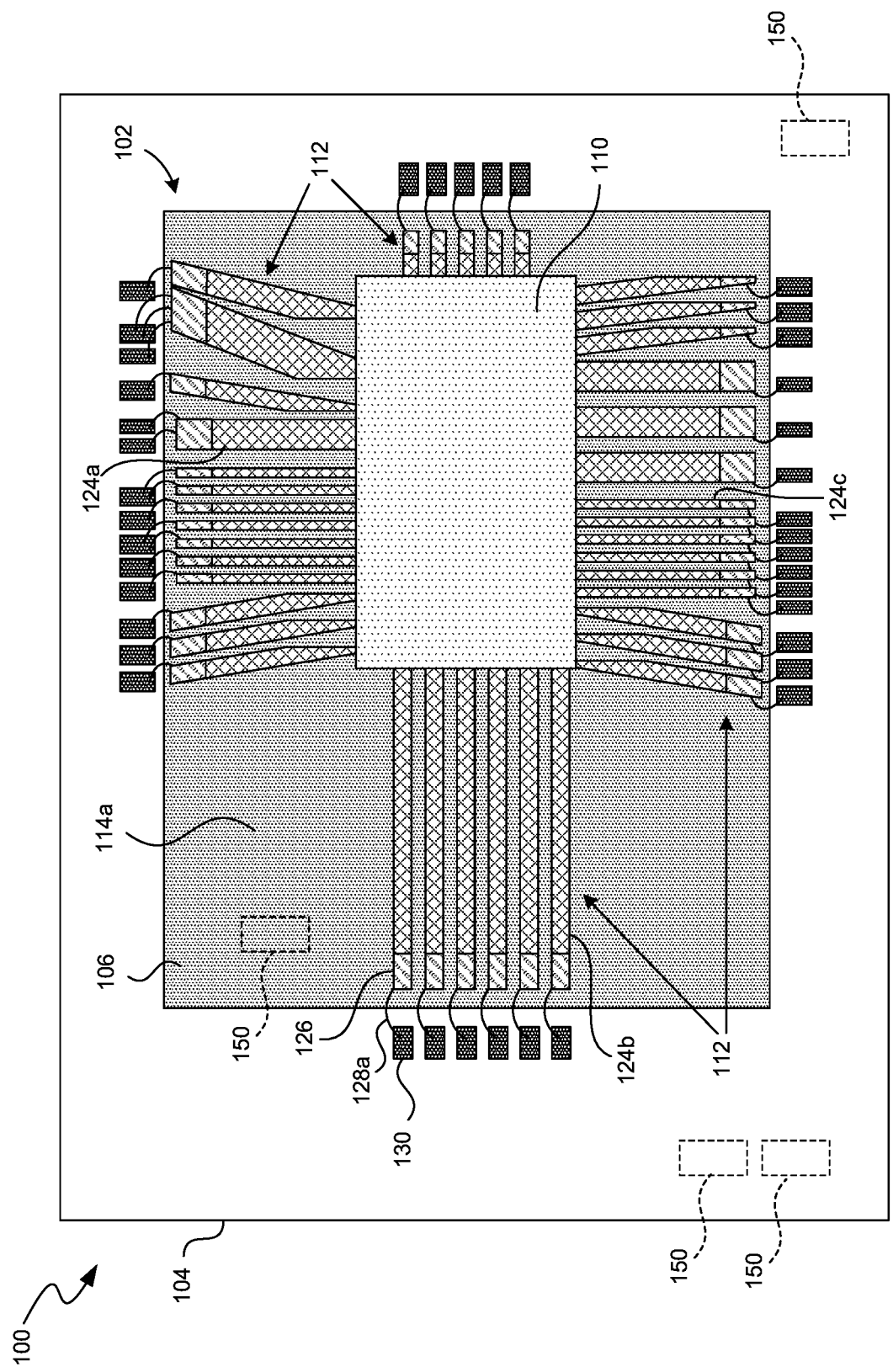
FIG. 1B is a top view of the semiconductor package of FIG. 1A.

FIGS. 1A and 1B illustrate a semiconductor package 100 configured in accordance with embodiments of the present technology. More specifically, FIG. 1A is a side cross-sectional view of the package 100 and FIG. 1B is a top view of the package 100. The package 100 includes a die stack 102 mounted on a package substrate 104, and a routing substrate 106 (e.g., a semiconductor die or interposer) mounted on the die stack 102. The die stack 102 includes a plurality of vertically-stacked semiconductor dies 108a-c (collectively, "first dies 108"; the first dies 108 are omitted from FIG. 1B merely for purposes of clarity). The first dies 108 can be arranged in a shingled or stepped configuration in which each die is offset horizontally from the die below to allow for electrical interconnections, as discussed in greater detail below. Although FIG. 1A depicts the die stack 102 as including three first dies 108a-c, in other embodiments, the die stack 102 can include fewer or more first dies 108 (e.g., one, two, four, five, six, seven, eight, nine, ten, or more dies). The package 100 further includes a second semiconductor die 110 ("second die 110") mounted on the routing substrate 106. The second die 110 can be a controller die (e.g., a microcontroller) that is configured to control the operations of the routing substrate 106 and/or first dies 108, as discussed in greater detail below.

The first and second dies 108, 110 can each include a semiconductor substrate (e.g., a silicon substrate, a gallium arsenide substrate, an organic laminate substrate, etc.). In some embodiments, the first and second dies 108, 110 each include a front and/or active surface having various types of semiconductor components. For example, the first dies 108 and/or the second die 100 can each have memory circuits (e.g., dynamic random-access memory (DRAM), static random-access memory (SRAM), flash memory (e.g., NAND, NOR), or other type of memory circuits), controller circuits (e.g., DRAM controller circuits), logic circuits, processing circuits, circuit elements (e.g., wires, traces, interconnects, transistors, etc.), imaging components, and/or other semiconductor features. In some embodiments, the first dies 108 can each be arranged in a "face-up" configuration with their front surfaces oriented upward and away from the package substrate 104. In other embodiments, however, one or more of the first dies 108 can be in a "face-down" configuration with their front surfaces oriented downward and toward the package substrate 104. Optionally, one or more of the first dies 108 can be a "blank" substrate that does not include semiconductor components and that is formed from, for example, crystalline, semi-crystalline, and/or ceramic substrate materials, such as silicon, polysilicon, aluminum oxide ($Al_2O_3$), sapphire, and/or other suitable materials.

The routing substrate 106 includes a redistribution structure 112 configured to route signals (e.g., control signals, ONFI signals, power signals, test signals, etc.) between the second die 110 and the first dies 108 of the die stack 102. The redistribution structure 112 can also route signals between the second die 110 and the routing substrate 106, e.g., in embodiments where the routing substrate 106 is a semiconductor die or otherwise includes functional components. As best seen in FIG. 1A, the routing substrate 106 can include an upper (e.g., front) surface 114a and a lower (e.g., back) surface 114b, and the redistribution structure 112 can have pads or other terminals exposed at the upper surface 114a. In some embodiments, the redistribution structure 112 is or includes a redistribution layer (RDL) (e.g., formed after a wafer probe test) or an in-line redistribution layer (iRDL) (e.g., formed before a wafer probe test).

The redistribution structure 112 can include one or more electrically conductive components, such as contacts, traces, pads, pins, wiring, circuitry, and the like, and one or more dielectric materials. The electrically conductive components of the redistribution structure 112 can be made of any suitable conductive material, such as one or more metals (e.g., copper, gold, titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). Although FIG. 1A illustrates the redistribution structure 112 as having a single routing or metallization layer, in other embodiments, the redistribution structure 112 can include multiple routing or metallization layers (e.g., two, three, four, five, or more layers).

The routing substrate 106 can be any component that is a suitable substrate for fabricating the redistribution structure 112. In some embodiments, the routing substrate 106 is a semiconductor die, e.g., a semiconductor die having features similar to the first and/or second dies 108, 110. For example, the routing substrate 106 can be a memory die (e.g., a NAND die, an SRAM die, etc.), and the first dies 108 can also be memory dies (e.g., NAND dies). Alternatively, the routing substrate 106 can be an interposer, such as an inorganic interposer (e.g., silicon, glass, ceramic, etc.) or an organic interposer (e.g., FR-4, polyimide, a coreless laminate, etc.). The redistribution structure 112 can be formed on the routing substrate 106 using any suitable techniques known to those of skill in the art, such as semiconductor fabrication processes (e.g., if the routing substrate 106 is a semiconductor die, inorganic interposer, or other inorganic substrate) or circuit board manufacturing processes (e.g., if the routing substrate 106 is an organic interposer or other organic substrate).

Optionally, the routing substrate 106 can include other functional components in addition to the redistribution structure 112. For example, the routing substrate 106 can include active circuit elements (e.g., transistors, memory circuits, controller circuits, logic circuits, or other semiconductor components) and the redistribution structure 112 is formed on or over the active circuit elements. In some embodiments, the routing substrate 106 is a memory die (e.g., a NAND die, SRAM die, etc.) and the redistribution structure 112 is formed on or over the memory circuits of the memory die. As another example, the routing substrate 106 can include passive circuit elements, such as capacitors, inductors, and/or resistors. The passive circuit elements can be formed in the routing substrate 106 using semiconductor fabrication techniques, or can be surface-mounted components attached to the routing substrate 106, as discussed in greater detail below. In other embodiments, however, the routing substrate 106 can be used solely to route signals between the second die 110 and the first dies 108 of the die stack 102, and may not include any additional active and/or passive circuit elements.

The second die 110 is electrically and mechanically coupled to the redistribution structure 112 on the routing substrate 106 by interconnect structures 118. As best seen in FIG. 1A, the second die 110 can include an upper (e.g., back) surface 116a and a lower (e.g., active and/or front) surface 116b. The second die 110 can be mounted to the routing substrate 106 in a face-to-face (F2F) configuration in which the lower surface 116b of the second die 110 faces the upper surface 114a and redistribution structure 112 of the routing substrate 106. In some embodiments, the second die 110 is connected directly to the routing substrate 106 without any intervening spacers, supports, other dies, etc., between the second die 110 and the routing substrate 106.

Figure 1C:
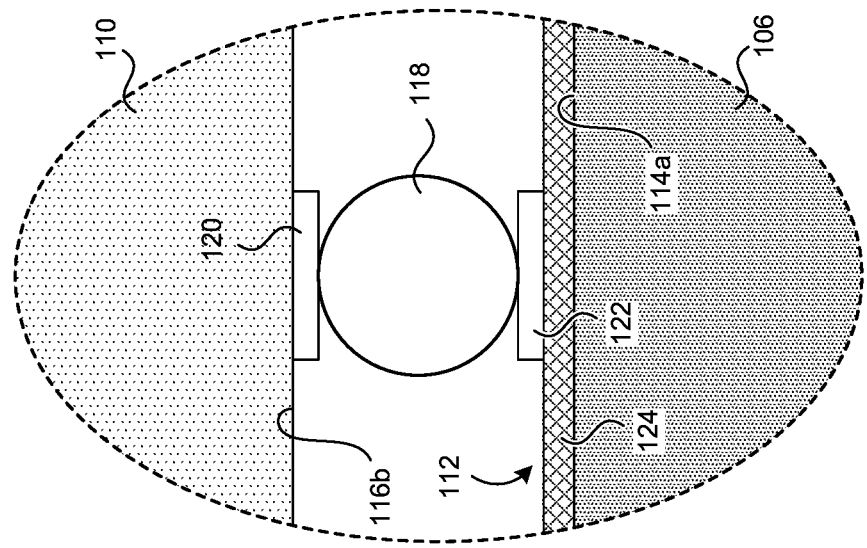
FIG. 1C is a closeup view of an interconnect structure of the semiconductor package of FIG. 1A.

Referring to FIGS. 1A and 1C together (FIG. 1C is a closeup view of an interconnect structure 118 of FIG. 1A), the interconnect structures 118 can be bumps, micro-bumps, pillars, columns, studs, etc., between the lower surface 116b of the second die 110 and the redistribution structure 112. As shown in FIG. 1C, each interconnect structure 118 can connect a pin or pad 120 on the second die 110 (e.g., a data pin, an address pin, a control pin, etc.) to a corresponding contact 122 of the redistribution structure 112. Although FIG. 1C illustrates a single pin 120 and a single contact 122, one skilled in the art will appreciate that the second die 110 can include a plurality of pins 120 and the redistribution structure 112 can include a corresponding plurality of contacts 122. The interconnect structures 118 can include any suitably conductive material such as copper, nickel, gold, silicon, tungsten, solder (e.g., SnAg-based solder), conductive-epoxy, combinations thereof, etc., and can be formed by electroplating, electroless-plating, or another suitable process. In some embodiments, the interconnect structures 118 also include barrier materials (e.g., nickel, nickel-based intermetallic, and/or gold; not shown) formed over end portions of the interconnect structures 118. The barrier materials can facilitate bonding and/or prevent or at least inhibit the electromigration of copper or other metals used to form the interconnect structures 118. Optionally, the interconnect structures 118 can be surrounded by an underfill material (not shown) between the routing substrate 106 and second die 110.

Referring to FIGS. 1B and 1C together, the redistribution structure 112 can include a plurality of traces 124 extending over the upper surface 114a of the routing substrate 106 to route signals from the second die 110 to the periphery of the routing substrate 106. The second die 110 can be located at the interior portion of the routing substrate 106 (FIG. 1B), and the traces 124 can extend from the locations of the interconnect structures 118 and contacts 122 (FIG. 1C) underneath the second die 110 to a plurality of bond pads 126 at the peripheral portions of the routing substrate 106. Each trace 124 can electrically connect a respective contact 122 (FIG. 1C) to a corresponding bond pad 126 (FIG. 1B) at the peripheral portion of the routing substrate 106. The traces 124 can be separated from each other by an insulating material (e.g., a dielectric material; not shown) to reduce or eliminate interference and/or cross-talk between individual traces 124.

The number, geometry, and arrangement of the traces 124 can be designed to provide different signal routing configurations and can be customized for the particular device or package. The traces 124 shown in FIG. 1B can extend to each of the four edges of the routing substrate 106. In other embodiments, however, the traces 124 can extend to fewer edges of the routing substrate 106, such as one edge, two edges, or three edges. Additionally, some or all of the traces 124 can have different geometries (e.g., different lengths, widths, shapes, etc.). For example, trace 124a is wider than trace 124b, which is wider than trace 124c. In some embodiments, the different geometries are used to accommodate different types of signals, e.g., wider traces can be used for power delivery, while narrower traces can be used for high speed data signals.

Referring again to FIGS. 1A and 1B together, the package 100 further includes a plurality of electrical connectors 128a-d (e.g., wirebonds) coupling the redistribution structure 112, package substrate 104, and first dies 108 to each other to route signals (e.g., control signals, ONFI signals, power signals, test signals, etc.) between these components. In some embodiments, the ends of each electrical connector are attached to respective bond pads on the corresponding package components (the bond pads on the redistribution structure 112 and first dies 108 are omitted in FIG. 1A merely for purposes of clarity). For example, the redistribution structure 112 can be electrically coupled to the package substrate 104 via one or more electrical connectors 128a extending between bond pads 126 of the redistribution structure 112 (FIG. 1B) and corresponding bond pads 130 on the package substrate 104. Accordingly, the redistribution structure 112 and electrical connectors 128a can route signals directly between the second die 110 and the package substrate 104 (e.g., power signals, signals to and/or from a host device).

The redistribution structure 112 and electrical connectors 128b-c can route signals between the second die 110 and each of the first dies 108 of the die stack 102. In the illustrated embodiment, for example, the package 100 includes at least one electrical connector 128b electrically coupling the redistribution structure 112 to the uppermost first die 108a to route signals directly between the second die 110 and the uppermost first die 108a. The package 100 can also include a cascading series of electrical connectors 128c connecting the first dies 108a-c to each other. For example, the uppermost first die 108a is electrically coupled to the first die 108b by one electrical connector 128c, and the first die 108b is electrically coupled to the lowermost first die 108c by another electrical connector 128c. Accordingly, the redistribution structure 112, electrical connectors 128b-c, and uppermost first die 108a can collectively route signals between the second die 110 and the first die 108b. Similarly, the redistribution structure 112, electrical connectors 128b-c, and first dies 108a-b can collectively route signals between the second die 110 and the lowermost first die 108c. Optionally, the package 100 can include at least one electrical connector 128d that electrically couples the lowermost first die 108c directly to the package substrate 104. The electrical connector 128d can route signals (e.g., test signals) directly between the lowermost first die 108c and the package substrate 104.

Although in the configuration of FIGS. 1A and 1B the electrical connectors 128a-d are depicted as wirebonds, the package 100 can include other types of electrical connectors for electrically coupling the redistribution structure 112, package substrate 104, routing substrate 106, and/or first dies 108 to each other. In other embodiments, for example, any of the die-to-die connections (e.g., between the routing substrate 106 and the uppermost first die 108a and/or between any of the first dies 108) and/or die-to-substrate connections (e.g., between the lowermost first die 108c and the package substrate 104) shown in FIGS. 1A and 1B can instead be implemented using through-silicon vias (TSVs), interconnect structures (e.g., bumps, micro-bumps, pillars, columns, studs, etc.), and/or any other interconnection techniques known to those of skill in the art. Moreover, in other embodiments, one or more of the electrical connectors 128a-d can be omitted. Additional examples of configurations for the electrical connectors 128a-d are discussed further below with respect to FIGS. 2A-2C.

The package substrate 104 can be or include an interposer, a printed circuit board, a dielectric spacer, another semiconductor die (e.g., a logic die), or another suitable substrate. In some embodiments, the package substrate 104 includes additional semiconductor components (e.g., doped silicon wafers or gallium arsenide wafers), nonconductive components (e.g., various ceramic substrates, such as aluminum oxide ($Al_2O_3$), etc.), aluminum nitride, and/or conductive portions (e.g., interconnecting circuitry, TSVs, etc.). The package substrate 104 can further include electrical connectors 134 (e.g., solder balls, conductive bumps, conductive pillars, conductive epoxies, and/or other suitable electrically conductive elements) electrically coupled to the package substrate 104 and configured to electrically couple the package 100 to an external device (not shown), such as a host device as discussed further below. Optionally, the package substrate 104 can include one or more signal routing structures or layers (not shown) including electrically conductive components such as traces, vias, etc., that transmit signals between the electrical connectors 134 and the second die 110 and/or die stack 102. As previously discussed, the configuration of the die stack 102, second die 110, and redistribution structure 112 described herein can reduce routing signals via the package substrate 104, such that the package substrate 104 can be thinner and/or less complex compared to conventional systems that route the controller signals through the package substrate. For example, the package substrate 104 can include no more than one, two, three, or four signal routing layers. The package substrate 104 can have a thickness less than or equal to 250 μm, 200 μm, 150 μm, 125 μm, 100 μm, or 75 μm.

The package 100 can further include a mold material or encapsulant 140 formed over at least a portion of the package substrate 104 and/or at least partially around the routing substrate 106 and the first and second dies 108, 110 (the mold material 140 is omitted from FIG. 1B merely for purposes of clarity). The mold material 140 can be a resin, epoxy resin, silicone-based material, polyimide, or any other material suitable for encapsulating the routing substrate 106, the first and second dies 108, 110, and/or at least a portion of the package substrate 104 to protect these components from contaminants and/or physical damage.

Optionally, the package 100 can include surface-mounted components 150 (best seen in FIGS. 1A and 1B), such as capacitors, resistors, inductors, and/or other circuit elements. The surface-mounted components can be on the package substrate 104 (e.g., at peripheral portions away from the die stack 102 and bond pads 130), on the routing substrate 106 (e.g., at locations away from the traces 124 and the second die 110-FIG. 1B), and/or any other suitable location. In some embodiments, the semiconductor package 100 includes other components such as external heatsinks, a casing (e.g., thermally conductive casing), electromagnetic interference (EMI) shielding components, etc.

In some embodiments, the package 100 is operably connected to a host device (not shown) via the electrical connectors 134. The host device can be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device can be a networking device (e.g., a switch, a router, etc.), a recorder of digital images, audio and/or video, a vehicle, an appliance, a toy, or any one of a number of other products. In some embodiments, the host device is connected directly to the package 100, while in other embodiments, the host device can be indirectly connected to the package 100 (e.g., over a networked connection or through intermediary devices).

For example, in some embodiments, the package 100 is a memory device and is configured to connect to a host device that utilizes memory for the temporary or persistent storage of information, or a component thereof. In such embodiments, the first dies 108 can be memory dies (e.g., NAND memory dies), and the second die 110 can be a memory controller. The routing substrate 106 can also be a memory die (e.g., a NAND memory die, an SRAM memory die). For example, the routing substrate 106 can be an SRAM memory die or other memory die that provides data storage for the operations of the memory controller. Alternatively, the routing substrate 106 may not include any memory circuits and may function solely to route signals between the memory controller and the individual memory dies. The memory device can include a plurality of external terminals that include command and address terminals coupled to a command bus and an address bus to receive command signals CMD and address signals ADDR, respectively. The memory device can further include a chip select terminal to receive a chip select signal CS, clock terminals to receive clock signals CK and CKF, data clock terminals to receive data clock signals WCK and WCKF, data terminals DQ, RDQS, DBI, and DMI to receive data signals, and/or power supply terminals VDD, VSS, and VDDQ.

The package 100 can be manufactured using any suitable process known to those of skill in the art. In some embodiments, for example, a manufacturing process for the package 100 includes forming the redistribution structure 112 on the routing substrate 106 using wafer-level or chip-level processes. Subsequently, the routing substrate 106 is mounted on the die stack 102 (e.g., via die attach film or other suitable techniques). The die stack 102 can be mounted on the package substrate 104 before, during, or after the routing substrate 106 is mounted on the die stack 102. The second die 110 can be mounted on the routing substrate 106 before, during, or after the routing substrate 106 is mounted on the die stack 102. In some embodiments, the second die 110 is mechanically and electrically coupled to the routing substrate 106 via the interconnect structures 118 using a thermocompression bonding (TCB) operation. The electrical connectors 128a-d can then be formed and attached to the routing substrate 106, the first and second dies 108, 110, and the package substrate 104 to electrically couple these components to each other, as discussed above.

Figure 2C:
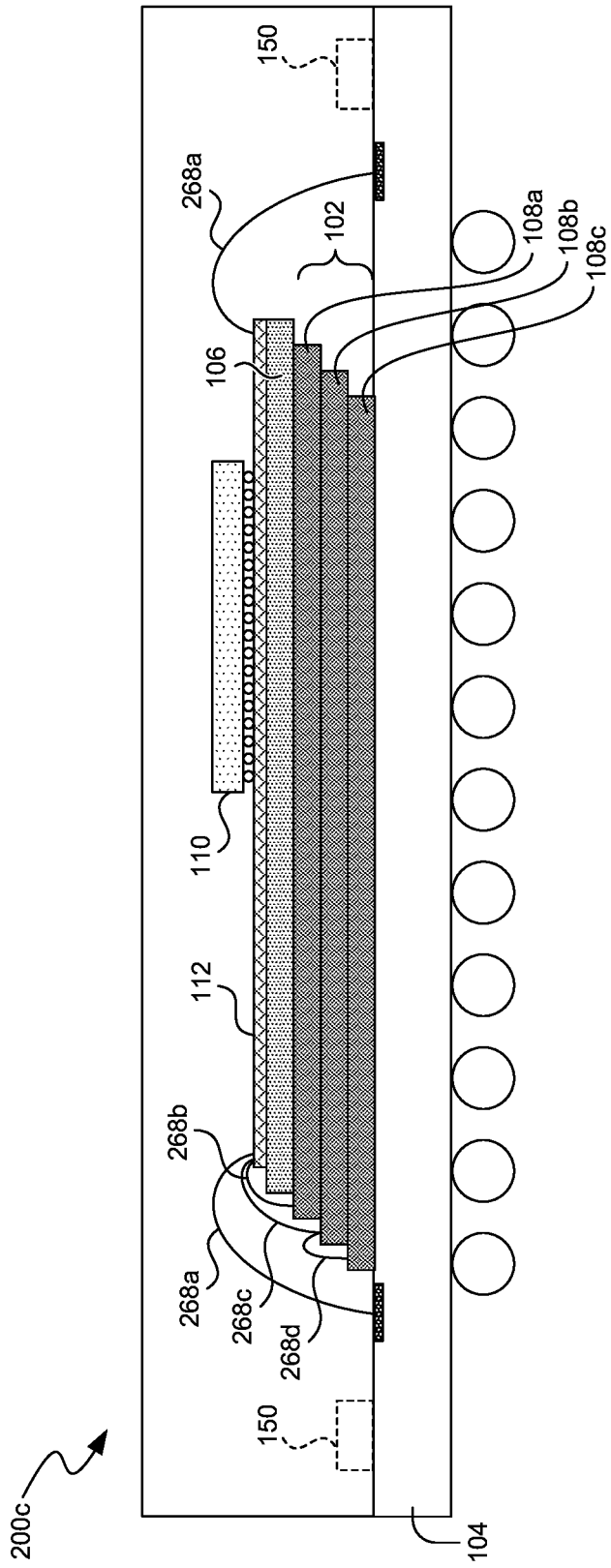
FIG. 2C is a side cross-sectional view of another semiconductor package including a plurality of electrical connectors configured in accordance with embodiments of the present technology.

FIGS. 2A-2C illustrate semiconductor packages with various arrangements of electrical connectors configured in accordance with embodiments of the present technology. The packages shown in FIGS. 2A-2C can be generally similar to the package 100 described with respect to FIGS. 1A-1C. Accordingly, like numbers are used to identify similar or identical components, and the description of the packages shown in FIGS. 2A-2C will be limited to those features that differ from the package 100 of FIGS. 1A-1C.

FIG. 2A illustrates a semiconductor package 200a including a plurality of electrical connectors 248a-c (e.g., wirebonds) for interconnecting the die stack 102, the package substrate 104, the routing substrate 106, and the second die 110. The electrical connectors 248a couple the redistribution structure 112 directly to the package substrate 104; the electrical connectors 248b couple the redistribution structure 112 directly to the uppermost first die 108a; and the cascading electrical connectors 248c couple the first dies 108a-c to each other in series. Unlike the package 100 of FIGS. 1A-1C, the package 200a does not include any electrical connectors that couple the lowermost first die 108c directly to the package substrate 104. Instead, the electrical connectors 248a-c, the redistribution structure 112, and the first dies 108a-b collectively route signals between the lowermost first die 108c and the package substrate 104.

FIG. 2B illustrates a semiconductor package 200b including a plurality of electrical connectors 258a-d (e.g., wirebonds) for interconnecting the die stack 102, the package substrate 104, the routing substrate 106, and the second die 110. The electrical connectors 258a couple the redistribution structure 112 directly to the package substrate 104. In the illustrated embodiment, each first die 108 is electrically coupled directly to the redistribution structure 112 via a respective set of electrical connectors. For example, the electrical connectors 258b couple the uppermost first die 108a directly to the redistribution structure 112; the electrical connectors 258c couple the first die 108b directly to the redistribution structure 112; and the electrical connectors 258d couple the lowermost first die 108c directly to the redistribution structure 112. Accordingly, the redistribution structure 112 and the electrical connectors 258b-d can transmit signals directly between the respective first die 108 and the second die 1102.

FIG. 2C illustrates a semiconductor package 200c including a plurality of electrical connectors 268a-d (e.g., wirebonds) for interconnecting the die stack 102, the package substrate 104, the routing substrate 106, and the second die 110. The electrical connectors 268a couple the redistribution structure 112 directly to the package substrate 104. In the illustrated embodiment, some of the first dies 108 are electrically coupled directly to the redistribution structure 112, while some of first dies 108 are coupled indirectly via other first dies 108. For example, the electrical connectors 268b-c couple the first dies 108a-b, respectively, directly to the redistribution structure 112, to provide direct signal transmission between the second die 110 and each of the first dies 108a-b. However, the lowermost first die 108c is not coupled directly to the redistribution structure 112. Instead, the electrical connector 268d couples the lowermost first die 108c to the first die 108b, and the first die 108b routes signals between the lowermost first die 108c and second die 110. In other embodiments, however, the package 200c can include different routing configurations between the second die 110 and the first dies 108.

Figure 3:
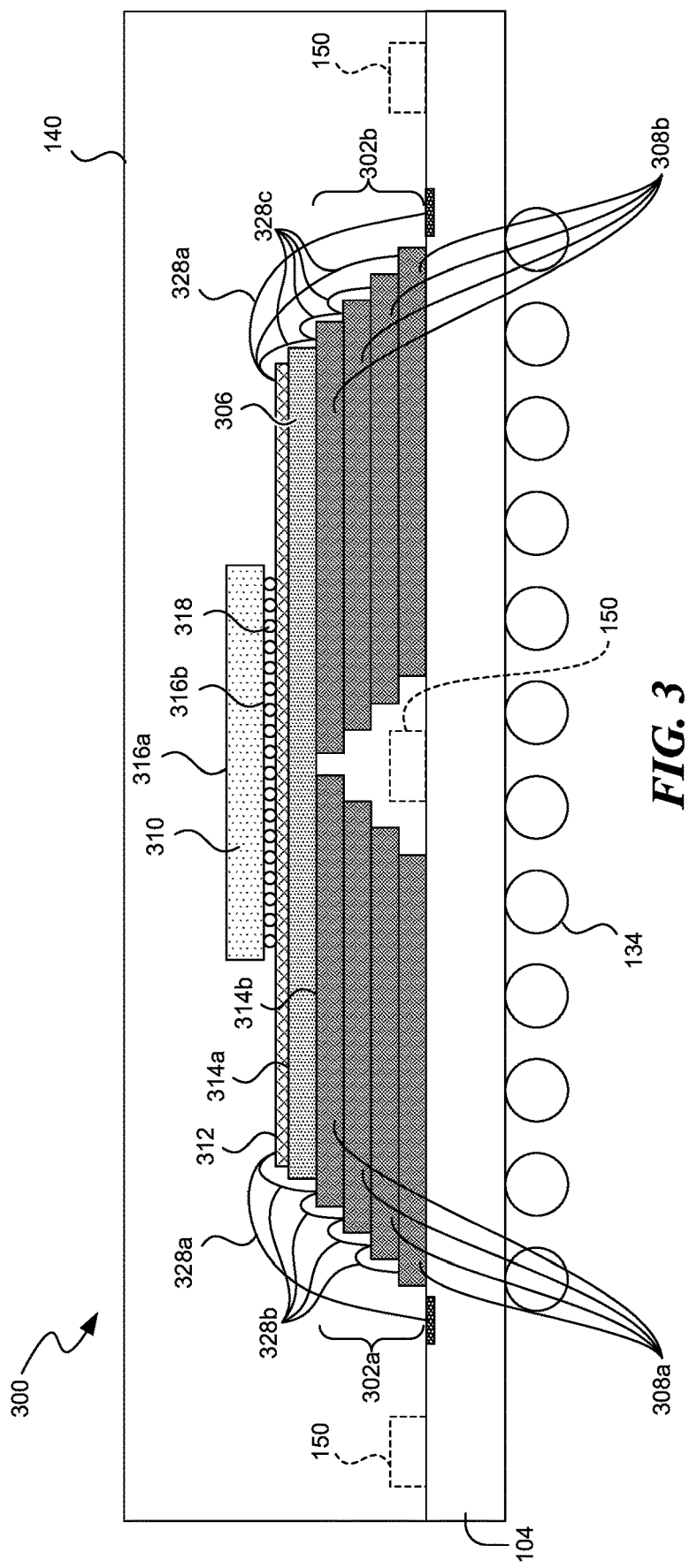
FIG. 3 is a side cross-sectional view of a semiconductor package configured in accordance with embodiments of the present technology.

FIG. 3 is a schematic cross-sectional view of a semiconductor package 300 configured in accordance with embodiments of the present technology. The package 300 can be generally similar to the packages described with respect to FIGS. 1A-2C, except that the package 300 includes multiple die stacks (e.g., first die stack 302a and second die stack 302b) rather than a single die stack. Accordingly, like numbers are used to identify similar or identical components (e.g., routing substrate 306 versus routing substrate 106), and the description of the package 300 will be limited to those features that differ from the packages of FIGS. 1A-2C.

The first and second die stacks 302a-b are mounted on a package substrate 104. The first and second die stacks 302a-b can each be identical or generally similar to the die stack 102 of FIGS. 1A-1C. For example, the first die stack 302a includes a first set of first semiconductor dies 308a (e.g., a first set of memory dies) and the second die stack 302b includes a second set of first semiconductor dies 308b (e.g., a second set of memory dies). In the illustrated embodiment, the first and second die stacks 302a-b are both arranged in a shingled configuration and are angled towards each other. In other embodiments, the first and second die stacks 302a-b can be angled away from each other, angled in parallel directions, or any other suitable configuration. Additionally, although the first and second die stacks 302a-b are depicted as each including four dies, in other embodiments, the first and/or second die stacks 302a-b can include fewer or more dies (e.g., one, two, three, five, or more dies). The first and second die stacks 302a-b can include the same number of dies and/or otherwise have the same or substantially similar heights.

The package 300 further includes a routing substrate 306 (e.g., another semiconductor die or an interposer) with a redistribution structure 312 formed on its upper surface 314a. The routing substrate 306 can be the same or generally similar to the routing substrate 106 of FIGS. 1A-2C, except that the routing substrate 306 is mounted on multiple die stacks (e.g., the first and second die stacks 302a-b). As shown in FIG. 3, the lower surface 314b of the routing substrate 306 is coupled to the uppermost dies in each of the first and second die stacks 302a-b. By bridging the first and second die stacks 302a-b, the routing substrate 306 can increase the mechanical strength of the package 300 (e.g., improved three-point bending performance) and reduce warpage (e.g., due to heating during manufacturing and/or operation).

The redistribution structure 312 (e.g., an iRDL or RDL structure) is configured to route signals between the first and second die stacks 302a-b and a second die 310 (e.g., a controller die) mounted on the routing substrate 306. The redistribution structure 312 can be the same or generally similar to the redistribution structure 112 of FIGS. 1A-2C, except that the redistribution structure 312 routes signals to multiple die stacks (e.g., the first and second die stacks 302a-b). Similarly, the second die 310 can be the same or generally similar to the second die 110 of FIGS. 1A-2C, except that the second die 310 communicates with multiple die stacks (e.g., the first and second die stacks 302a-b). The second die 310 can include an upper (e.g., back) surface 316a facing away from the routing substrate 306, and a lower (e.g., active and/or front) surface 316b facing toward the upper surface 314a and redistribution structure 312 of the routing substrate 306. The second die 310 can be electrically and mechanically coupled to the redistribution structure 312 via interconnect structures 318.

In some embodiments, the redistribution structure 312 is electrically coupled to the package substrate 104, the first die stack 302a, and/or the second die stack 302b via a plurality of electrical connectors 328a-c (e.g., wirebonds). For example, the package 300 can include a set of electrical connectors 328a connecting the redistribution structure 312 to the package substrate 104, a set of electrical connectors 328b connecting the redistribution structure 312 to the first set of first dies 308a of the first die stack 302a, and/or a set of electrical connectors 328c connecting the redistribution structure 312 to the second set of first dies 308b of the second die stack 302b. Accordingly, the electrical connectors 328a-c and redistribution structure 312 can route signals (e.g., control signals, ONFI signals, power signals, test signals, etc.) between the second die 310, first die stack 302a, second die stack 302b, package substrate 104, and/or routing substrate 306. In the illustrated embodiment, the electrical connectors 328b are arranged as a cascading series, while the electrical connectors 328c include both cascading connectors and connectors that connect directly to individual dies. In other embodiments, however, any of the electrical connectors 328a-c can be arranged differently (e.g., as previously discussed with respect to FIGS. 2A-2C), or can be omitted altogether. Additionally, the package 300 can include additional electrical connectors not shown in FIG. 3, such as electrical connectors between a die and the package substrate 104.

Optionally, the package 300 can include one or more surface-mounted components 150, such as capacitors, resistors, inductors, and/or other circuit elements. The surface-mounted components can be on the package substrate 104 (e.g., at peripheral portions away from the first and second die stacks 302a-b, between the first and second die stacks 302a-b), on the routing substrate 106, or any other suitable location.

The package 300 can be manufactured using any suitable process known to those of skill in the art. In some embodiments, for example, a manufacturing process for the package 300 includes mounting the first and second die stacks 302a-b on the package substrate 104. The process further includes forming the redistribution structure 312 on the routing substrate 306 using wafer-level or chip-level processes. Subsequently, the routing substrate 306 is mounted on the first and second die stacks 302a-b (e.g., via die attach film or other suitable techniques). The second die 310 can be mounted on the routing substrate 306 before, during, or after the routing substrate 306 is mounted on the first and second die stacks 302a-b. The electrical connectors 328a-c can then be formed and attached to the routing substrate 306, the first and second die stacks 302a-b, and the package substrate 104 to electrically couple these components to each other, as discussed above.

Although FIG. 3 illustrates a package 300 with a routing substrate 306 configured to transmit signals between two die stacks, in other embodiments, the package 300 can include a greater number of die stacks, such as three, four, five or more die stacks. In such embodiments, the routing substrate 306 can be mechanically and electrically coupled to each of the die stacks to route signals between the die stacks, a controller die (e.g., second die 310), and/or the package substrate 104.

Figure 4:
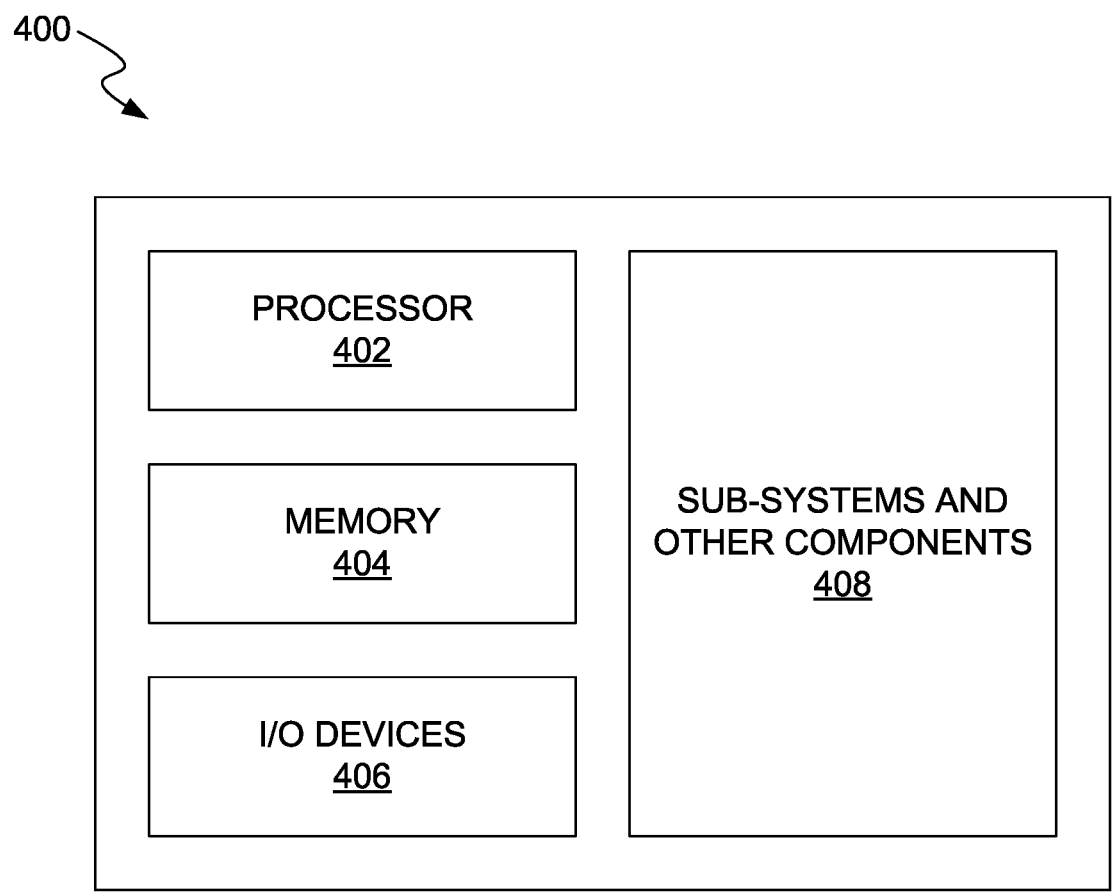
FIG. 4 is a schematic view of a system that includes a semiconductor device or package configured in accordance with embodiments of the present technology.

Any one of the semiconductor devices and/or packages having the features described above with reference to FIGS. 1A-3 can be incorporated into any of a myriad of larger and/or more complex systems, a representative example of which is system 400 shown schematically in FIG. 4. The system 400 can include a processor 402, a memory 404 (e.g., SRAM, DRAM, flash, and/or other memory devices), input/output devices 406, and/or other subsystems or components 408. The semiconductor dies and/or packages described above with reference to FIGS. 1A-3 can be included in any of the elements shown in FIG. 4. The resulting system 400 can be configured to perform any of a wide variety of suitable computing, processing, storage, sensing, imaging, and/or other functions. Accordingly, representative examples of the system 400 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 400 include lights, cameras, vehicles, etc. With regard to these and other example, the system 400 can be housed in a single unit or distributed over multiple interconnected units, e.g., through a communication network. The components of the system 400 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor assembly, comprising:
   a package substrate;
   a die stack supported by the package substrate and including a plurality of semiconductor dies;
   a routing substrate mounted on the die stack, wherein the routing substrate includes an upper surface facing away from the die stack;
   a redistribution structure formed above the upper surface of the routing substrate, wherein the redistribution structure includes a plurality of contacts at an interior portion of the redistribution structure and a plurality of bond pads at a peripheral portion of the redistribution structure;
   a plurality of electrical connectors coupling the plurality of bond pads of the redistribution structure to the plurality of semiconductor dies of the die stack; and
   a controller die mounted on the routing substrate, wherein the controller die includes an active surface that faces the redistribution structure and is electrically coupled to the plurality of contacts of the redistribution structure, wherein the plurality of semiconductor dies are electrically coupled to the controller die via the redistribution structure exclusive of any intervening electrical connection that is routed through the package substrate.

2. The semiconductor assembly of claim 1, wherein the routing substrate is a semiconductor die.

3. The semiconductor assembly of claim 2, wherein the routing substrate is a memory die.

4. The semiconductor assembly of claim 1, wherein the routing substrate is an organic or inorganic interposer.

5. The semiconductor assembly of claim 1, wherein the redistribution structure includes a plurality of routing layers.

6. The semiconductor assembly of claim 1, further comprising a plurality of interconnect structures coupling the active surface of the controller die to the redistribution structure of the routing substrate.

7. The semiconductor assembly of claim 6, wherein the redistribution structure includes a plurality of traces, wherein each trace connects a respective contact of the plurality of contacts at the interior portion to a respective bond pad of the plurality of bond pads at the peripheral portion.

8. The semiconductor assembly of claim 7, wherein at least some of the plurality of traces have different widths as viewed directly above the redistribution structure.

9. The semiconductor assembly of claim 1, wherein the plurality of semiconductor dies comprises one or more memory dies.

10. The semiconductor assembly of claim 1, wherein:
the die stack is a first die stack and the semiconductor dies are first semiconductor dies;
the semiconductor assembly further comprises a second die stack including a plurality of second semiconductor dies; and
the routing substrate is mounted on the first and second die stacks such that the second semiconductor dies are electrically coupled to the controller die via the redistribution structure.

11. The semiconductor assembly of claim 10, wherein the electrical connectors are first electrical connectors, and the semiconductor assembly further comprises a plurality of second electrical connectors coupling the redistribution structure to at least some of the second semiconductor dies of the second die stack.

12. The semiconductor assembly of claim 1, wherein the package substrate is coupled to the die stack and the controller die via the redistribution structure and the plurality of electrical connectors.

13. The semiconductor assembly of claim 12, wherein the package substrate includes no more than two routing layers.

14. The semiconductor assembly of claim 1, wherein the routing substrate further includes one or more passive circuit elements.

15. A method of manufacturing a semiconductor assembly, the method comprising:
forming a redistribution structure above an upper surface of a routing substrate;
mounting a controller die on the upper surface of the routing substrate such that an active surface of the controller die faces the upper surface and is electrically coupled to the redistribution structure; and
coupling a lower surface of the routing substrate to a die stack including a plurality of semiconductor dies.

16. The method of claim 15 wherein the active surface of the controller die is electrically coupled to the redistribution structure via a thermocompression bonding process.

17. The method of claim 16 wherein the thermocompression bonding process comprises connecting the active surface to the redistribution structure with a plurality of interconnect structures.

18. The method of claim 15, further comprising electrically coupling the redistribution structure to at least some of the semiconductor dies with a plurality of wirebonds.

19. The method of claim 15, further comprising mounting the die stack on a package substrate.

20. The method of claim 18, further comprising electrically coupling the redistribution structure to the package substrate with one or more wirebonds.

21. The method of claim 15 wherein the die stack is a first die stack and the semiconductor dies are first semiconductor dies, and the method further comprises coupling the lower surface of the routing substrate to a second die stack including a plurality of second semiconductor dies.

22. The method of claim 15 wherein the redistribution structure is formed using a wafer-level process.

23. The method of claim 15 wherein forming the redistribution structure comprises forming a plurality of traces, at least some of the traces having different widths.

24. The method of claim 15 wherein the redistribution structure is configured to route signals between the controller die and the die stack.

* * * * *